(12) United States Patent
Tsukada et al.

(10) Patent No.: US 6,319,327 B1
(45) Date of Patent: Nov. 20, 2001

(54) MOCVD SYSTEM

(75) Inventors: Akihiko Tsukada, Sagamihara; Akihiko Hiroe; Kouji Shimomura, both of Kofu, all of (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/624,488

(22) Filed: Jul. 24, 2000

(30) Foreign Application Priority Data

Jul. 27, 1999 (JP) .................................................. 11-212874

(51) Int. Cl.[7] .................................................. C23C 16/00

(52) U.S. Cl. .......................... 118/719; 118/724; 118/726

(58) Field of Search .................................. 118/719, 724, 118/726

(56) References Cited

FOREIGN PATENT DOCUMENTS

| 2-283029 | 11/1990 | (JP) . |
| 10-79378 | 3/1998 | (JP) . |

*Primary Examiner*—Richard Bueker
(74) *Attorney, Agent, or Firm*—Oblon, Spivak, McClelland, Maier & Neustadt, P.C.

(57) ABSTRACT

Disclosed is an MOCVD system for forming a tantalum oxide film on a semiconductor wafer, while using pentoethoxytantalum as a liquid raw material. In the system, a raw material tank is connected to a vaporizing unit through an upstream main line with a flow control unit. The vaporizing unit is connected to the process chamber of a film-forming unit through a downstream main line. A partition wall is arranged to surround the entire system so as to isolate it from the other space in the clean room. The raw material tank, the flow control unit, and part of the upstream main line therebetween are accommodated in a constant temperature and heat insulating box all together and are kept at a temperature of from 25 to 35° C.

20 Claims, 4 Drawing Sheets

MOCVD SYSTEM

CROSS-REFERENCE TO RELATED APPLICATIONS

This application is based upon and claims the benefit of priority from the prior Japanese Patent Application No. 11-212874, filed Jul. 27, 1999, the entire contents of which are incorporated herein by reference.

BACKGROUND OF THE INVENTION

The present invention relates to an MOCVD (Metal Organic Chemical Vapor Deposition) system used in semiconductor processes, and particularly to a system for forming a metal oxide film, such as a tantalum oxide ($Ta_2O_5$) film, on a target substrate, while using as a liquid raw material a metal organic compound that is in a liquid phase at room temperature (about 20° C.). The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD (Liquid Crystal Display) substrate, by forming semiconductor layers, insulating layers, and conductive layers in predetermined patterns on the target substrate.

In order to manufacture semiconductor devices, film formation and pattern etching are repeatedly applied to a semiconductor wafer. As semiconductor devices are increasingly highly miniaturized and integrated, demands on film formation become more strict. For example, very thin insulating films, such as capacitor insulating films and gate insulating films are still required to be thinner and to be more insulating.

Conventionally, silicon oxide films and silicon nitride films are used as the insulating films. In recent years, however, it has been proposed to form the insulating films from materials having more excellent insulating properties, such as metal oxides, e.g., tantalum oxide ($Ta_2O_5$), or high-dielectric or ferroelectric bodies containing two metal elements or more, e.g., $(Ba,Sr)TiO_3$, i.e., BST. These films can be formed by means of MOCVD, i.e., using vaporized metal organic compounds.

Jpn. Pat. Appln. KOKAI Publication No. 2-283029 discloses an MOCVD technique for forming a tantalum oxide film. In the technique disclosed in this publication, a metal (tantalum) alkoxide, such as $Ta(OC_2H_5)_5$ (pentoethoxytantalum) is used as a liquid raw material. The liquid raw material is made to bubble by e.g., nitrogen gas, and is supplied to a process chamber preset to have a vacuum atmosphere. The supplied raw material is decomposed to offer a film forming material on the surface of a semiconductor wafer W heated to a process temperature of, e.g., 400° C. With this film forming material, a tantalum oxide ($Ta_2O_5$) film is formed on the surface of the semiconductor wafer W by means of deposition.

In this system, however, it is difficult to control the supply rate of the raw material with a high accuracy. This is because the liquid raw material is supplied by means of bubbling, and thus the flow rate of the liquid raw material is hardly accurately controlled. As a result, the supply rate of the raw material finally supplied to the process chamber shifts from the target value, thereby lowering reproducibility in the film thickness and quality of a formed CVD film.

Jpn. Pat. Appln. KOKAI Publication No. 10-79378 discloses another MOCVD technique for forming a tantalum oxide film, developed in light of the above described problem. In the technique disclosed in this publication, a liquid raw material the same as that of the former publication is delivered by the pressure of an inactive gas. The liquid raw material is supplied, while its flow rate is being controlled, and then is vaporized and turned into a process gas. The process gas is supplied to a process chamber and used for forming a CVD film on a semiconductor wafer.

FIG. 5 is a structural diagram schematically showing a conventional MOCVD system disclosed in the KOKAI Publication No. 10-79378.

In this system, a liquid raw material 4, such as pentoethoxytantalum, is stored in a raw material tank 2 and is delivered by the pressure of a pressurized gas, such as He gas. The stored liquid raw material 4 is heated by a heater 6 to a temperature of, e.g., from 20 to 50° C., at which the liquid raw material 4 can easily flow. The delivered liquid raw material 4 flows downstream, while its flow rate is being controlled by a flow control unit 8, and then is vaporized and turned into a process gas by an inactive gas, such as He gas, in a vaporizing unit 10.

The process gas flows in a gas supply line 14, which is wrapped by, e.g., a tape heater 12 for preventing the process gas from being turned back to liquid, and enters a film-forming unit 16. The process gas is supplied from a showerhead 19 into a process chamber 18, and then is decomposed to offer a film forming material on the surface of a semiconductor wafer W heated to a process temperature. With this film forming material, a tantalum oxide film is formed on the surface of the semiconductor wafer W by means of deposition.

The system of the KOKAI Publication No. 10-79378 can control the supply rate of the raw material more accurately than the former system. Depending on a situation, sometimes the latter system still lowers reproducibility in the film thickness and quality of a formed CVD film, sometimes as the case may be. Furthermore, the system includes heated members, such as the vaporizing unit 10, pipes, and so forth, other than the process chamber 18, and thus thermally influences the ambient environment.

BRIEF SUMMARY OF THE INVENTION

An object of the present invention is to provide an MOCVD system, which can offer a high reproducibility in the film thickness and quality of a formed CVD film.

Another object of the present invention is to provide an MOCVD system, which less thermally influences the ambient environment, but can offer a high reproducibility in the film thickness and quality of a formed CVD film.

According to a first aspect of the present invention, there is provided an MOCVD system for forming a metal oxide film on a target substrate, while using as a liquid raw material a metal organic compound that is in a liquid phase at room temperature:

an airtight process chamber;

a support member disposed in the process chamber and configured to support the target substrate;

an exhaust mechanism configured to exhaust the process chamber and set the process chamber to have a vacuum atmosphere;

a downstream main line connected to the process chamber and configured to supply a process gas thereto;

a vaporizing unit connected to the downstream main line outside the process chamber, and configured to heat the liquid raw material to a temperature higher than a vaporizing temperature of the liquid raw material and turn the liquid raw material into the process gas;

an upstream main line connected to the vaporizing unit and configured to supply the liquid raw material thereto;

a raw material tank connected to the upstream main line outside the process chamber and configured to store the liquid raw material;

a flow control unit arranged on the upstream main line between the raw material tank and the vaporizing unit; and a temperature maintaining mechanism configured to maintain the raw material tank and the flow control unit at a temperature, which is lower than the vaporizing temperature and higher than the room temperature.

According to a second aspect of the present invention, there is provided an MOCVD system installed inside a clean room, for forming a metal oxide film on a target substrate, while using as a liquid raw material a metal organic compound that is in a liquid phase at room temperature:

an airtight process chamber;

a support member disposed in the process chamber and configured to support the target substrate;

an exhaust mechanism configured to exhaust the process chamber and set the process chamber to have a vacuum atmosphere;

a downstream main line connected to the process chamber and configured to supply a process gas thereto;

a vaporizing unit connected to the downstream main line outside the process chamber, and configured to heat the liquid raw material to a temperature higher than a vaporizing temperature of the liquid raw material and turn the liquid raw material into the process gas;

an upstream main line connected to the vaporizing unit and configured to supply the liquid raw material thereto;

a raw material tank connected to the upstream main line outside the process chamber and configured to store the liquid raw material;

a flow control unit arranged on the upstream main line between the raw material tank and the vaporizing unit;

a partition wall configured to form an isolated space inside the clean room to be isolated from the other space in the clean room, the isolated space enveloping the process chamber, the downstream main line, the vaporizing unit, the upstream main line, the raw material tank, and the flow control unit all together; and a temperature maintaining mechanism configured to maintain the raw material tank, the flow control unit, and part of the upstream main line therebetween at a temperature, which is lower than the vaporizing temperature and higher than the room temperature, wherein the temperature maintaining mechanism comprises a constant temperature and heat insulating box disposed in the isolated space and accommodating the raw material tank, the flow control unit, and part of the upstream main line therebetween all together.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 5:
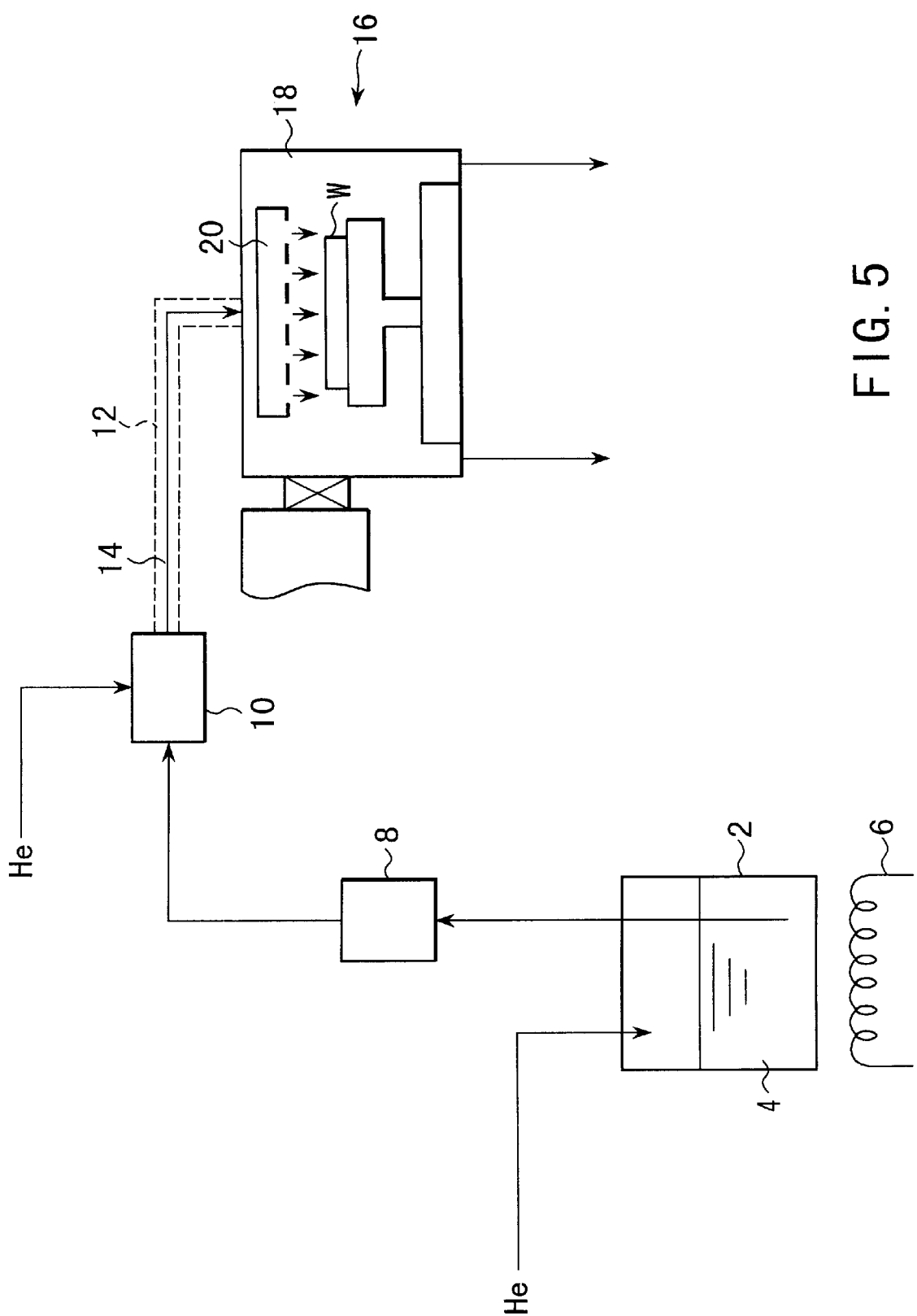
FIG. 5 is a structural diagram schematically showing a conventional MOCVD system.

In the process of developing the present invention, the present inventors conducted research on MOCVD systems of the type as show in FIG. 5, as to why reproducibility in the film thickness and quality of a formed CVD film was lowered. As a result, the present inventors have arrived at the finding given below.

The system shown in FIG. 5 is constituted by gathering the parts to be assembled in a narrow space in a clean room, in light of the cost of the space of the clean room, the use efficiency of the raw material, the system maintenance, and so forth. Consequently, the liquid raw material line and the flow control unit 8 are apt to receive thermal influences from other units in the same system. The liquid raw material 4 has certain physical characteristics, such as viscosity, depending on the temperature given from the heater 6, when it is delivered from the tank 2. However, these physical characteristics may greatly vary due to the temperature of the flow control unit 8 side.

Since the liquid raw material 4 is supplied to the vaporizing unit 10 through the flow control unit 8, the supply rate of the liquid raw material 4 can be accurately controlled under ideal conditions. However, when the liquid raw material 4 has its physical characteristics changed due to a temperature difference between the tank 2 and the flow control unit 8, the supply rate of the liquid raw material 4 fluctuates, thereby lowering reproducibility in the film thickness and quality of a formed CVD film.

Embodiments of the present invention, made on the basis of the above described findings, will be described hereinafter with reference to the accompanying drawings. In the following description, the constituent elements having substantially the same function and arrangement are denoted by the same reference numerals, and a repetitive description will be made only when necessary.

Figure 1:
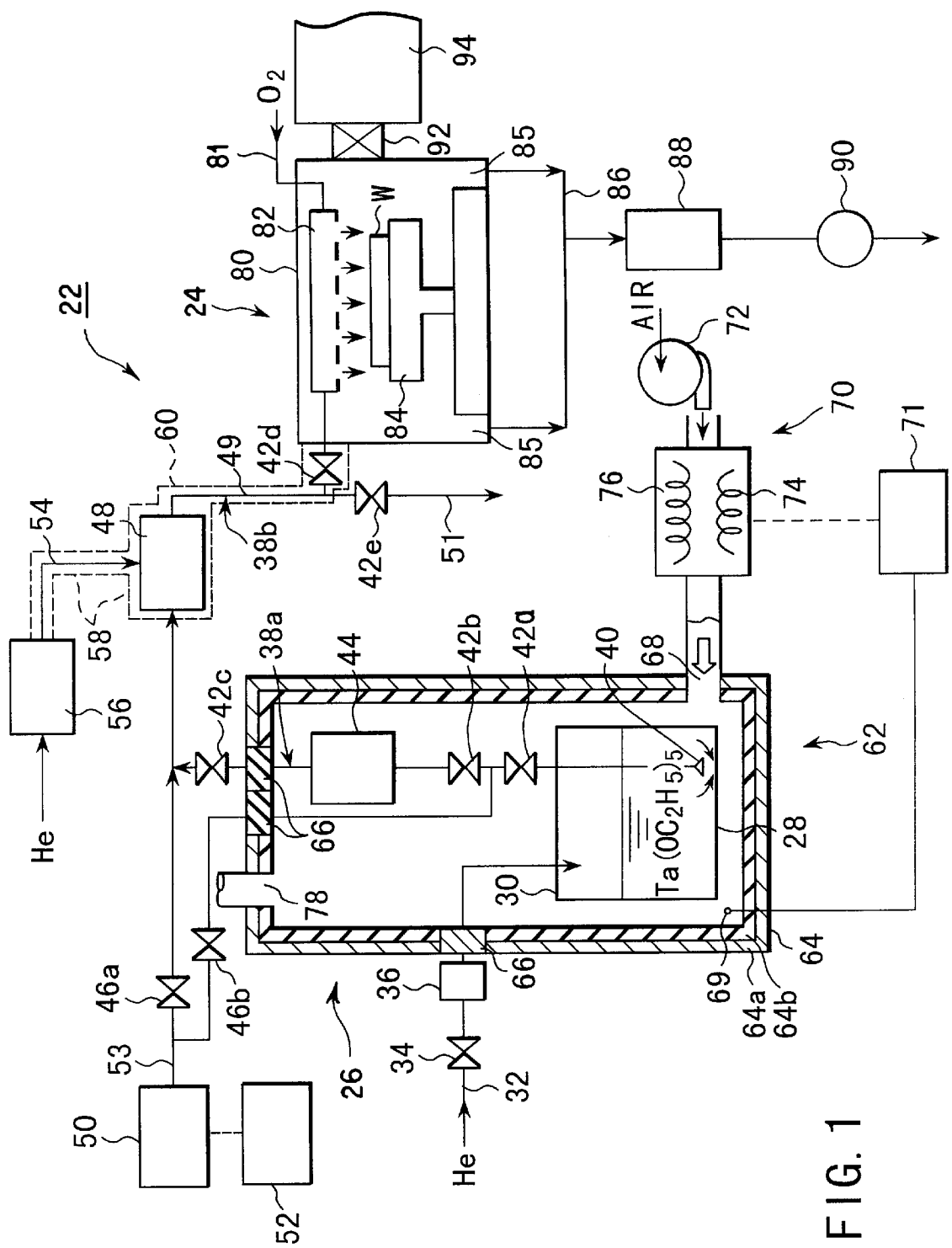
FIG. 1 is a structural diagram schematically showing an MOCVD system according to an embodiment of the present invention.

FIG. 1 is a structural diagram schematically showing an MOCVD system according to an embodiment of the present invention. This embodiment is exemplified by a process of forming a tantalum oxide ($Ta_2O_5$) film, as an example of a metal oxide film.

The MOCVD system 22 is constituted of a film-forming unit 24 for subjecting a semiconductor wafer or target substrate W to a film-forming process, and a raw material supply section 26 for vaporizing the liquid raw material to produce a process gas and supplying the process gas to the film-forming unit 24.

The raw material supply section 26 includes an airtight raw material tank 30, which stores a liquid raw material 28 used for providing a film-forming material. The liquid raw material 28 consists of, e.g., pentoethoxytantalum (Ta(OC$_2$H$_5$)$_5$), which is a metal alkoxide. The raw material tank 30 has a vapor phase space, into which the tip of a pressurizing line 32 is introduced from the top. The pressurizing line 32 is arranged to supply a pressurized gas, such as He gas, into the vapor phase space of the tank 30. The pressurizing line 32 is provided with a valve 34 and a flow controller 36, such as a mass-flow controller.

The raw material tank 30 is connected to a vaporizing unit 48 through an upstream main line 38a formed of, e.g., stainless steel pipes. The vaporizing unit 48 is connected to the film-forming unit 24 through a downstream main line 38b formed of, e.g., stainless steel pipes. The pipes of the upstream main line 38a have an inner diameter of from about 1 to 2 mm, because the liquid flow rate is generally as small as e.g., about 5 mg/min. On the other hand, the pipes of the downstream main line 38b have a large inner diameter of from about 10 to 20 mm, because the gaseous raw material or process gas flows therein.

The upstream end 40 of the upstream main line 38a is dipped into the liquid raw material 28 down to a position near the bottom of the raw material tank 30. When the pressurized gas is supplied into the raw material tank 30 through the pressuring line 32, the liquid raw material 28 is delivered into the line 38a by the pressure of the gas. The upstream main line 38a is provided with a flow control unit 44 for controlling the flow rate of the liquid raw material 28. For example, a Liquid Mss-Flow Controller (TM) of LIN-TEX KABUSHIKIKAISHA is used as the flow control unit 44. The upstream and downstream lines 38a and 38b are provided with switching valves 42a to 42d. Note that only representative valves are shown in FIG. 1 for the sake of convenience, though many switching valves are actually arranged on the lines 38a and 38b.

The vaporizing unit 48 is used for vaporizing the liquid raw material 28 and turning it into the process gas. A vaporizing gas supply line 54 is connected to the vaporizing unit 48 and is provided with a flow controller 56. A vaporizing gas, such as He gas heated to a temperature of from 150 to 160° C., is supplied to the vaporizing unit 48 through the line 54 while its flow rate is being controlled. In the vaporizing unit 48, the He gas is mixed with the liquid raw material 28, so that the liquid raw material 28 is vaporized and turned into the process gas.

The vaporizing unit 48 itself and that portion of the line 54 between the vaporizing unit 48 and the flow controller 56 are wrapped with a temperature maintaining heater 58, such as a tape heater. The vaporizing gas and the vaporizing unit 48 are heated and kept at a temperature of from 150 to 160° C. by the heater 58, so as to assist vaporizing of the liquid raw material 28. The downstream main line 38b from the vaporizing unit 48 is also wrapped with a temperature maintaining heater 60, such as a tape heater. The process gas in the line 38b is kept at a temperature of, e.g., from 150 to 180° C., which is higher than the vaporizing temperature (i.e., condensing temperature) of the raw material, and lower than the decomposing temperature of the raw material.

The film-forming unit 24 includes an airtight process chamber 80 formed of, e.g., aluminum and having a cylindrical shape. A load lock chamber 94 is connected to a side of the process chamber 80 through a gate valve 92, which is airtightly opened and closed. The semiconductor wafer or target substrate W is transferred between the load lock chamber 94 and the process chamber 80 through the gate valve 92.

A showerhead 82 is arranged on the ceiling of the process chamber 80 and connected to the downstream end of the downstream main line 38b. Another line 81 is also connected to the showerhead 82 independently of the downstream main line 38b, for supplying 02 gas as a second process gas. The first process gas containing pentoethoxytantalum and a second gas containing 02 are spouted into the process space from a number of holes formed in the bottom of the showerhead 82.

A worktable 84 is arranged on the bottom of the process chamber 80 and provided with a heater embedded therein. The semiconductor wafer or target substrate W is mounted on the top surface of the worktable 84. Exhaust ports 85 are formed in the bottom of the process chamber 80 and connected to a vacuum exhaust line 86. The vacuum exhaust line 86 is provided with a removing unit 88 for removing the residual raw material and byproducts in the exhaust gas, and a vacuum pump 90 for exhausting the process chamber 80 and setting it to have a vacuum atmosphere.

Figure 2:
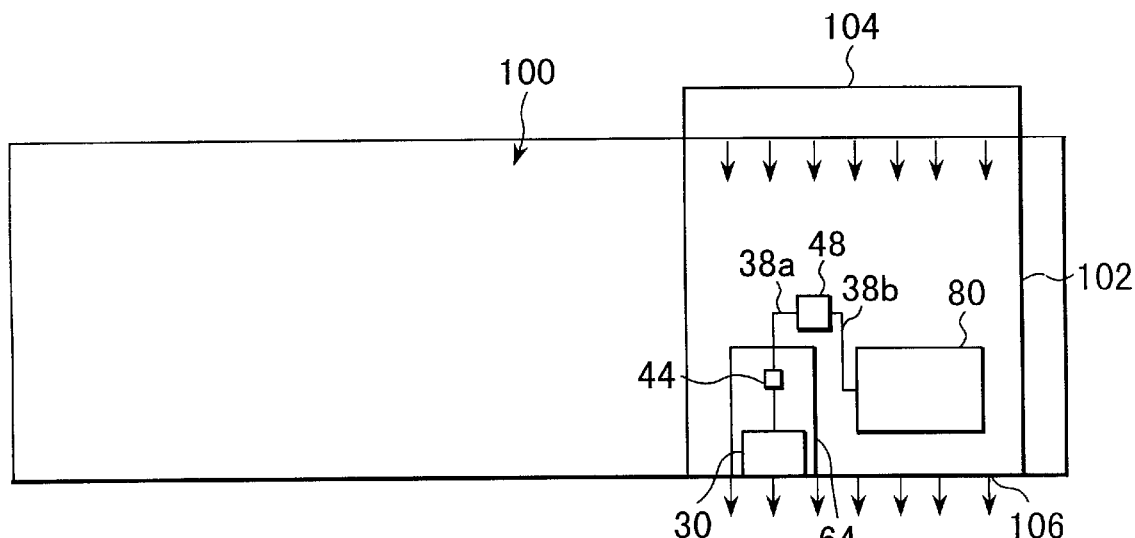
FIG. 2 is a side view schematically showing the MOCVD system of FIG. 1 installed in a clean room.
Figure 3:
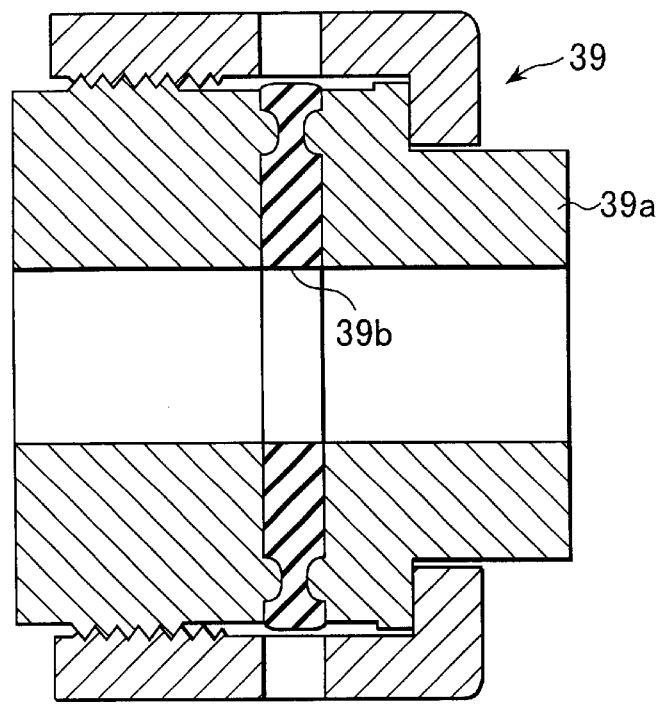
FIG. 3 is a sectional view showing a joint used in the upstream and downstream main lines of the MOCVD system of FIG. 1.

The MOCVD system shown in FIG. 1 is installed in a clean room. FIG. 2 is a side view schematically showing the MOCVD system of FIG. 1 installed in the clean room.

In the system shown in FIG. 1, the vaporizing unit 48, the film-forming unit 24, and the portions therebetween are heated to a temperature of from 150 to 180° C., which is higher than the vaporizing temperature of the raw material, and lower than the decomposing temperature of the raw material. These members are surrounded by heat-insulators, but thermally influence the ambient atmosphere to some extent. Besides, the used raw material is a substance which may contaminate the work environment. Furthermore, in light of the use efficiency of the raw material and the system maintenance, the raw material supply section 26 is preferably disposed near the film-forming unit 24.

Accordingly, in this embodiment, the whole MOCVD system is made compact and surrounded by a partition or surrounding wall 102 with a door panel in the clean room 100, such that the system is completely isolated from the other space in the clean room 100. In other words, the process chamber 80, downstream main line 38b, vaporizing unit 48, upstream main line 38a, raw material tank 30, and flow control unit 44 are enveloped all together within the isolated space formed by the partition wall 102. Furthermore, a device 104 for forcibly supplying air is disposed on the ceiling of the isolated space inside the partition wall 102, while exhaust holes 106 are formed in the floor thereof, so that the isolated space inside the partition wall 102 is forcibly ventilated.

Since the whole system is enveloped by the surrounding or partition wall 102, the temperature of the isolated space inside the partition wall 102 becomes relatively higher with an increase in the process time period, even though the high temperature members are covered with heat-insulators and the isolated space inside the partition wall 102 is forcibly ventilated. If the raw material supply section 26, as a whole, is directly exposed to the atmosphere inside the partition wall 102, the upstream main line 38a and the flow control unit 44, which have a small thermal capacity, are easily heated, depending on the temperature of the space inside the partition wall 102. Under this assumption, the physical characteristics of the liquid raw material 28 vary while the liquid 28 flows from the tank 30 to the flow control unit 44, thereby further lowering reproducibility in the film thickness and quality of a formed CVD film than in a case where there is no partition wall 102.

For this reason, a temperature maintaining mechanism 62 is arranged to maintain the raw material tank 30, the flow control unit 44, and the part of the upstream main line 38a therebetween at a predetermined warming temperature, which is lower than the vaporizing temperature and higher than room temperature. More specifically, the temperature maintaining mechanism 62 includes a constant temperature and heat insulating box 64 for accommodating these members all together inside the partition wall 102. The box 64 is constituted of a shell 64a made of a metal, such as stainless steel, and a heat insulating layer 64b made of a non-metal material, such as urethane or silicone, and formed on the inner surface of the shell. The constant temperature and heat insulating box 64 is provided with seal members 66 at positions through which the pressurizing line 32 and the upstream main line 38a penetrate, so that the box 64 is airtight.

A supply port 68 is formed in a lower position of a sidewall of the constant temperature and heat insulating box 64, for introducing therein a temperature control gas, which has been warmed. An exhaust port 78 is formed in the ceiling of the box 64, for exhausting the temperature control gas. The supply portion 68 is connected to a temperature control ventilation unit 70 for forcibly ventilating the inside of the box 64 with the temperature control gas. The ventilation unit 70 includes a blower 70 for blowing air taken from the outside of the surrounding or partition wall 102 into the box 64, and a heating chamber 76 having a resistance heater 74 for heating the air from the blower 72.

The temperature maintaining mechanism 62 also has a sensor 69 disposed in the constant temperature and heat insulating box 64, for detecting the temperature inside the box 64. The temperature detected by the sensor 69 is supplied to the temperature controller 71, which electrically controls the calorific value of the heater 74 on the basis of the detected temperature. With this arrangement, the warming temperature inside the box 64, i.e., the temperature of the temperature control gas is kept constant. Where the liquid raw material 28 is pentoethoxytantalum having a melting point of about 22° C., the warming temperature is set to fall in a range of 30±5° C., and preferably 30±1° C.

An explanation will given of a mechanism for cleaning the line pipes of the system shown in FIG. 1.

A cleaning liquid supply mechanism 50 used for cleaning the inside of the system is connected to the upstream main line 38a through lines 53 at two positions, i.e., the outlet of the raw material tank 30 and immediately before the vaporizing unit 48. The cleaning liquid supply mechanism 50 is designed to supply an alcohol, such as ethanol, in a pressurized state, so as to wash out byproducts deposited in the upstream main line 38a, vaporizing unit 48, and so forth.

The downstream main line 38b has a vertical line portion 49 as the main portion, so that deposition of byproducts is suppressed, and non-vaporized parts of the raw material are not supplied to the film-forming unit 24, but freely fall down through a vent line 51. In other word, the downstream main line 38b is designed to have a pipe portion extending downward more than a half of its length from the vaporizing unit 48 to the film-forming unit 24. The vent line 51 is blanched from the vertical line portion 49, and vertically extends downward.

Furthermore, if the raw material is left in the upstream and downstream main lines 38a and 38b when the system is cleaned, an abnormality is caused in a CVD film formed in the next process. In order to solve this problem, the upstream and downstream main lines 38a and 38b have a special structure as follows. Specifically, the upstream and downstream main lines 38a and 38b consist of pipe portions and joints connecting the pipe portions to each other. Each of the joints 39 is constituted of a main body 39a and a packing 39b, which form a surface having no irregularity to be in contact with the liquid raw material or the process gas. With this arrangement, no dead spaces are formed in the upstream and downstream main lines 38a and 38b, so that the above described problem is prevented.

The cleaning liquid supply mechanism 50 is operated under the control of a cleaning controller 52. The cleaning controller 52 is also configured to automatically select the opening/closing of valves in the system in accordance with different cleaning modes. More specifically, when the system is cleaned, the opening/closing of the valves 46a, 46b, and 42a to 42e arranged on the lines 53 of the cleaning liquid supply mechanism 50, the upstream and downstream main lines 38a and 38b, and the vent line 51 is selected by the cleaning controller 52.

An explanation will be given of an MOCVD process performed in the system shown in FIG. 1.

First, an unprocessed semiconductor wafer W is transferred from the load lock chamber 94 into the process chamber 80 in a vacuum state through the opened gate valve 92, and is mounted on the worktable 84. Then, the wafer W is kept at a predetermined process temperature of, e.g., 400° C., higher than the decomposing temperature of the raw material, and the process chamber 80 is kept at a predetermined process pressure. In this state, the first process gas containing pentoethoxytantalum and the second gas containing 02 are supplied to start film-forming.

In the raw material supply section 26, the pressurized gas, e.g., He gas, is supplied, while its flow rate is controlled, into the raw material tank 30. With this pressure, the liquid raw material 28 is delivered through the upstream main line 38a while its flow rate is controlled by the flow control unit 44. At this time, the supply rate of the pressurized gas is several hundreds SCCM, for example, and the supply rate of the liquid raw material is as small as several mg/min, for example, though they depend on the film-forming rate.

The liquid raw material thus delivered by the pressure is vaporized and turned into a process gas in the vaporizing unit 48 by the vaporizing gas, e.g., He gas, which is controlled to be supplied at a flow rate of, e.g., from about 200 to 500 SCCM. The process gas is supplied though the downstream main line 38b into the showerhead 82 in the process chamber 80. The raw material or process gas is spouted into the process chamber 80 from the showerhead 82, as described above.

The downstream main line 38a is heated to a predetermined temperature of, e.g., from 150 to 180° C. by the heater 60, so that the raw material gas is prevented from being turned back to liquid or being thermally decomposed, and thus stably flows to the showerhead 82. On the other hand, the vaporizing unit 48 and the vaporizing gas are heated to an optimum temperature of, e.g., about 160° C. by the heater 58, and thus the liquid raw material is efficiently and swiftly vaporized.

The raw material tank 30, the flow control unit 44, and the part of the upstream main line 38a therebetween are accommodated in the constant temperature and heat insulating box 64 all together. The temperature control gas, e.g., air in this embodiment, is heated to a predetermined temperature, and is supplied into the box 64 from the temperature control ventilation unit 70. With this arrangement, the liquid raw material 28 is kept at a substantially constant temperature of from 25 to 35° C. (30±5° C.), and preferably from 29 to 31° C. (30±1° C.). Consequently, the liquid raw material 28 is delivered by pressure through the upstream main line 38a smoothly with a constant low viscosity. Furthermore, the liquid raw material 28 hardly has its physical characteristics, such as viscosity, changed during this time, and thus can have its flow rate accurately controlled by the flow control unit 44.

The temperature control gas is introduced into the constant temperature and heat insulating box 64 from the supply port 68 formed at a lower position, and exhausted from the exhaust port formed at an upper position. With this arrangement, the temperature control gas reaches all over inside the box 64, so that the inside of the box 64 is uniformly kept at a predetermined heated temperature, as described above.

Figure 4:
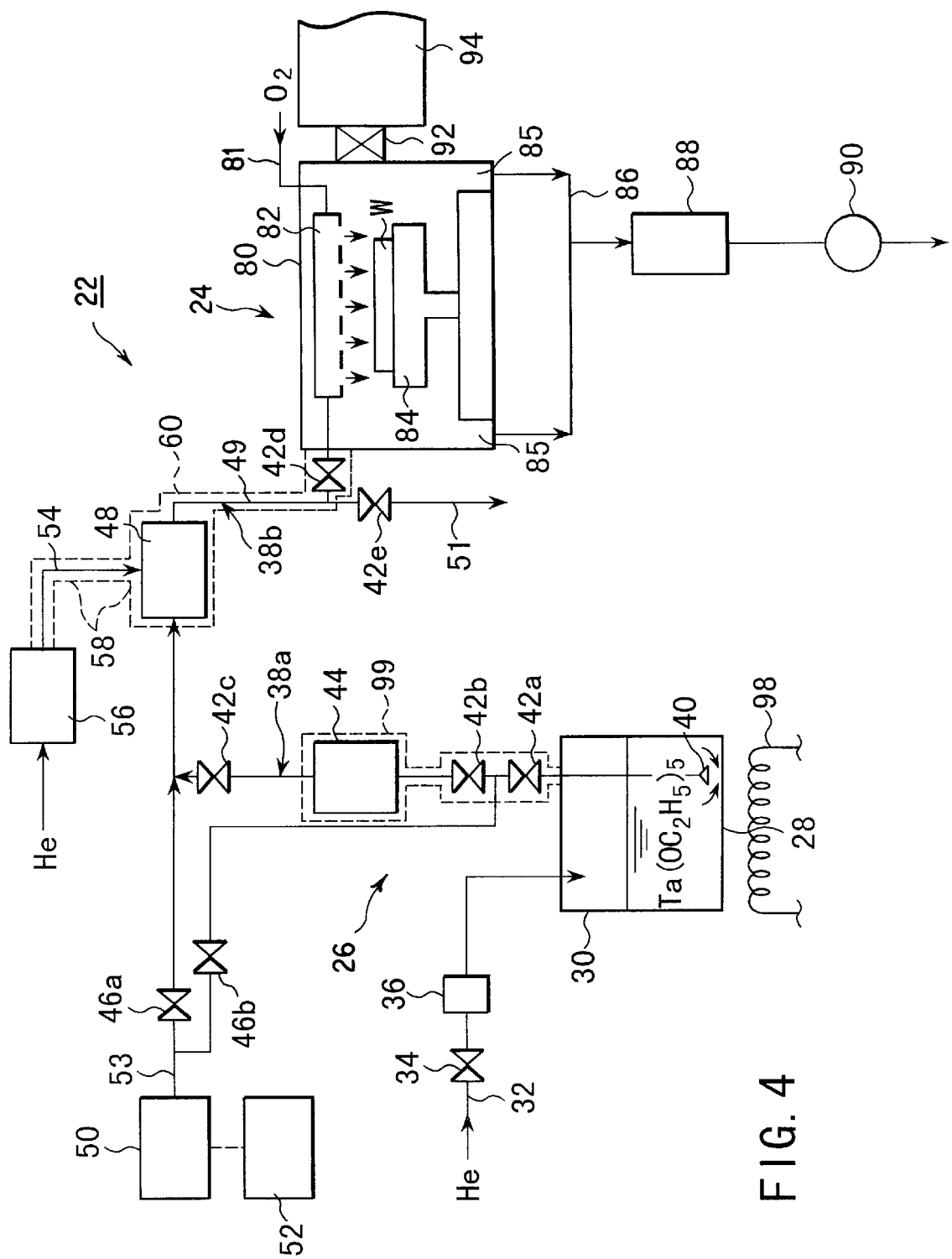
FIG. 4 is a structural diagram schematically showing an MOCVD system according to another embodiment of the present invention.

Note that, although the raw material tank 30, the flow control unit 44, and so forth are accommodated in the constant temperature and heat insulating box 64 all together in this embodiment, these members 30, 44 may have their temperature independently controlled. FIG. 4 is a structural diagram schematically showing an MOCVD system according to another embodiment of the present invention, constituted in light of this concept.

In the system shown in FIG. 4, the constant temperature and heat insulating box 64 and the temperature control ventilation unit 70 of the system shown in FIG. 1 are not used. Instead, a raw material tank 30 is provided with a heater 98, and a flow control unit 44 and the part of an upstream main line 38a between the raw material tank 30 and the flow control unit 44 are wrapped with a temperature maintaining mechanism, such as a tape heater 99.

The raw material tank 30, the flow control unit 44, and the part of the upstream main line 38a therebetween are kept at a temperature of 30+5° C., and preferably 30±1° C., by the heaters 98 and 99. With this arrangement, this system produces an effect the same as that of the system shown in FIG. 1. Note that, in a case where the part of the upstream main line 38a between the raw material tank 30 and the flow control unit 44 is short, with which the liquid raw material 28 does not have its temperature changed so much, that part of the upstream main line 38a may not be wrapped with the tape heater 99.

Although the above described embodiments are exemplified by a case where a tantalum oxide film is formed, the present invention is applicable to any MOCVD system for forming a metal oxide film on a target substrate, while using as a liquid raw material a metal organic compound that is in a liquid phase at room temperature. For example, the present invention may be applied to a process of forming a film of titanium oxide, zirconium oxide, barium oxide, or strontium oxide, while using the corresponding metal alkoxide as a liquid raw material. The present invention may be also applied to a process of forming a film of niobium oxide, hafnium oxide, yttrium oxide, or lead oxide.

Furthermore, the present invention is not limited to a film-forming unit of the type shown in the embodiments. For example, the present invention may employ a film-forming unit of the lamp-heating type, or of the plasma-using type. As regards a target substrate, the present invention may be applied to a case where an LCD glass substrate is processed, instead of a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An MOCVD system for forming a metal oxide film on a target substrate, while using as a liquid raw material a metal organic compound that is in a liquid phase at room temperature:

an airtight process chamber;

a support member disposed in the process chamber and configured to support the target substrate;

an exhaust mechanism configured to exhaust the process chamber and set the process chamber to have a vacuum atmosphere;

a downstream main line connected to the process chamber and configured to supply a process gas thereto;

a vaporizing unit connected to the downstream main line outside the process chamber, and configured to heat the liquid raw material to a temperature higher than a vaporizing temperature of the liquid raw material and turn the liquid raw material into the process gas;

an upstream main line connected to the vaporizing unit and configured to supply the liquid raw material thereto;

a raw material tank connected to the upstream main line outside the process chamber and configured to store the liquid raw material;

a flow control unit arranged on the upstream main line between the raw material tank and the vaporizing unit; and a temperature maintaining mechanism configured to maintain the raw material tank and the flow control unit at a temperature, which is lower than the vaporizing temperature and higher than the room temperature.

2. The system according to claim 1, wherein the temperature maintaining mechanism comprises a constant temperature and heat insulating box accommodating the raw material tank, the flow control unit, and part of the upstream main line therebetween all together.

3. The system according to claim 2, wherein the constant temperature and heat insulating box is constituted of a metal shell and a non-metal heat insulating layer formed on an inner surface of the shell.

4. The system according to claim 2, wherein the temperature maintaining mechanism comprises a temperature control ventilation unit configured to ventilate an inside of the constant temperature and heat insulating box with a warmed temperature control gas.

5. The system according to claim 4, wherein the temperature control ventilation unit comprises a blower configured to blow the temperature control gas into the constant temperature and heat insulating box, and a heater configured to heat the temperature control gas.

6. The system according to claim 5, wherein the temperature maintaining mechanism comprises a sensor configured to sense a temperature inside the constant temperature and heat insulating box, and a controller configured to electrically control a calorific value of the heater based on a temperature sensed by the sensor.

7. The system according to claim 4, wherein the temperature control gas is introduced into the constant temperature and heat insulating box from a lower position on the box and is exhausted from an upper position on the box.

8. The system according to claim 1, wherein the liquid raw material consists essentially of pentoethoxytantalum, and the warming temperature is set to fall in a range of from 25 to 35° C.

9. The system according to claim 8, wherein the warming temperature is set to fall in a range of from 29 to 31° C.

10. The system according to claim 1, further comprising a mechanism configured to heat all the downstream main line between the vaporizing unit and the process chamber to a temperature higher than the vaporizing temperature.

11. The system according to claim 1, further comprising a cleaning liquid supply mechanism connected to the upstream main line and configured to supply a cleaning liquid for cleaning the upstream main line in a cleaning mode.

12. The system according to claim 11, further comprising a controller configured to automatically select opening/closing of valves arranged on the upstream and downstream main lines, in accordance with the cleaning mode.

13. The system according to claim 11, wherein the downstream main line is designed to have a pipe portion extending downward more than a half of its length from the vaporizing unit, and a vent line extending downward is blanched from the pipe portion.

14. The system according to claim 11, wherein the upstream and downstream main lines comprise pipe portions and joints connecting the pipe portions to each other, and the joints have a surface having substantially no irregularity to be in contact with the liquid raw material and the process gas.

15. The system according to claim 11, wherein the liquid raw material and the cleaning liquid consist essentially of pentoethoxytantalum and ethanol, respectively.

16. An MOCVD system installed inside a clean room, for forming a metal oxide film on a target substrate, while using as a liquid raw material a metal organic compound that is in a liquid phase at room temperature:

an airtight process chamber;

a support member disposed in the process chamber and configured to support the target substrate;

an exhaust mechanism configured to exhaust the process chamber and set the process chamber to have a vacuum atmosphere;

a downstream main line connected to the process chamber and configured to supply a process gas thereto;

a vaporizing unit connected to the downstream main line outside the process chamber, and configured to heat the liquid raw material to a temperature higher than a vaporizing temperature of the liquid raw material and turn the liquid raw material into the process gas;

an upstream main line connected to the vaporizing unit and configured to supply the liquid raw material thereto;

a raw material tank connected to the upstream main line outside the process chamber and configured to store the liquid raw material;

a flow control unit arranged on the upstream main line between the raw material tank and the vaporizing unit;

a partition wall configured to form an isolated space inside the clean room to be isolated from the other space in the clean room, the isolated space enveloping the process chamber, the downstream main line, the vaporizing unit, the upstream main line, the raw material tank, and the flow control unit all together; and a temperature maintaining mechanism configured to maintain the raw material tank, the flow control unit, and part of the upstream main line therebetween at a temperature, which is lower than the vaporizing temperature and higher than the room temperature, wherein the temperature maintaining mechanism comprises a constant temperature and heat insulating box disposed in the isolated space and accommodating the raw material tank, the flow control unit, and part of the upstream main line therebetween all together.

17. The system according to claim 16, further comprising a mechanism configured to ventilate the isolated apace.

18. The system according to claim 16, wherein the constant temperature and heat insulating box is constituted of a metal shell and a non-metal heat insulating layer formed on an inner surface of the shell.

19. The system according to claim 16, wherein the temperature maintaining mechanism comprises a temperature control ventilation unit configured to ventilate an inside of the constant temperature and heat insulating box with a warmed temperature control gas.

20. The system according to claim 16, wherein the liquid raw material consists essentially of pentoethoxytantalum, and the warming temperature is set to fall in a range of from 25 to 35° C.

* * * * *